United States Patent
Onishi et al.

(10) Patent No.: US 6,206,985 B1
(45) Date of Patent: *Mar. 27, 2001

(54) Al ALLOY FILMS AND MELTING Al ALLOY SPUTTERING TARGETS FOR DEPOSITING Al ALLOY FILMS

(75) Inventors: Takashi Onishi; Kazuo Yoshikawa; Seiji Nishi; Seigou Yamamoto, all of Kobe (JP)

(73) Assignee: Kabushiki Kaisha Kobe Seiko Sho, Kobe (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/385,889

(22) Filed: Aug. 30, 1999

Related U.S. Application Data

(60) Continuation of application No. 08/888,784, filed on Jul. 7, 1997, now Pat. No. 5,976,641, which is a division of application No. 08/264,763, filed on Jun. 23, 1994, now abandoned, which is a continuation of application No. 07/842,556, filed on Feb. 27, 1992, now abandoned.

(30) Foreign Application Priority Data

| Mar. 7, 1991 | (JP) | 3-41651 |
|---|---|---|
| Apr. 23, 1991 | (JP) | 3-92250 |
| Apr. 23, 1991 | (JP) | 3-92251 |
| Sep. 10, 1991 | (JP) | 3-230497 |

(51) Int. Cl.[7] ............................................. C22C 21/00
(52) U.S. Cl. ..................... 148/437; 420/552; 204/298.13
(58) Field of Search ........................... 148/437; 420/552; 204/298.13

(56) References Cited

U.S. PATENT DOCUMENTS

| 2,781,261 | 2/1957 | Kanlet . |
|---|---|---|
| 3,387,970 | 6/1968 | Wainer . |
| 3,470,426 | 9/1969 | Feldman . |

(List continued on next page.)

FOREIGN PATENT DOCUMENTS

| 876652 | 7/1971 | (CA) . |
|---|---|---|
| 39-24205 | 10/1964 | (JP) . |

(List continued on next page.)

OTHER PUBLICATIONS

Matsui et al., "Formation of amorphous Al–Cr and Al–Mn alloy films by rf sputtering", Journal of Non–Crystalline Solids 124, pp. 121–130.

Binary Phase Diagrams Handbook, William G. Moffatt, 1976, General Electric, USA.

"Microstructural Characterization of Rapidly solidified Al–Ta Alloys", Metallurgical Transactions A, vol. 18A, Nov. 1987, S. Singh, et al, India.

Notice of Oppositin From The Equivalent Japanese Application, HEI 04–099171.

G. D. Davis, et al, "Evolution of the Chemistry of Passive Films of Sputter–Deposited, Supersaturated Al Alloys", J. Electrochem. Soc., vol. 137, No. 2, Feb. 1990, pp. 422–427.

Stanley Wolf, Ph.D., "Silicon Processing for the VLSI Era", vol. 2: "rocess Integration" TK 7874.W6, 1986 V.2, C.10, pp. 1–11, 182–187.

James J. Brophy, "Basic Electronics for Scientists", 1966, pp. 6–7, 50–55.

*Primary Examiner*—George Wyszomierski
*Assistant Examiner*—Janelle Combs-Morillo
(74) *Attorney, Agent, or Firm*—Oblon, Spivak, McClelland, Maier & Neustadt, P.C.

(57) ABSTRACT

An Al alloy film containing one kind or two or more kinds of alloy components selected from a group of Ti, Zr, Hf, V, Nb, Ta, Cr, Mo and Mn in a total amount of 0.1 to 10 at %, and a melting Al alloy sputtering target for depositing the Al alloy film, wherein the above-mentioned film is used as a reflection film for an optical recording medium, a shading film for a liquid crystal display panel or for a solid image pickup device, and an Al alloy thin film line or electrode material for a semiconductor device.

11 Claims, 15 Drawing Sheets

U.S. PATENT DOCUMENTS

| | | |
|---|---|---|
| 3,862,017 | 1/1975 | Tsunemitsu et al. . |
| 3,955,039 | 5/1976 | Roschy et al. . |
| 4,024,567 | 5/1977 | Iwata et al. . |
| 4,085,011 | 4/1978 | Juergens et al. . |
| 4,606,981 | 8/1986 | Mizuhara . |
| 4,743,317 * | 5/1988 | Skinner et al. ................ 148/437 |
| 4,929,421 | 5/1990 | Jin et al. . |
| 5,016,081 * | 5/1991 | Brown et al. ................ 357/67 |
| 5,018,004 | 5/1991 | Okinaga et al. . |
| 5,019,891 | 5/1991 | Onuki et al. . |
| 5,041,700 | 8/1991 | Iyogi et al. . |
| 5,051,812 | 9/1991 | Onuki et al. . |
| 5,100,488 | 3/1992 | Sigworth . |
| 5,124,779 | 6/1992 | Furukawa et al. . |
| 5,541,007 | 7/1996 | Ueda et al. . |
| 5,654,058 | 8/1997 | Kirino et al. . |
| 5,809,393 * | 9/1998 | Dunlop et al. ................ 419/61 |
| 5,976,641 * | 11/1999 | Onishi et al. ................ 428/1.3 |

FOREIGN PATENT DOCUMENTS

| | | |
|---|---|---|
| 47-33547 | 8/1972 | (JP) . |
| 47-23071 | 10/1972 | (JP) . |
| 48-33488 | 10/1973 | (JP) . |
| 61-8971 | 1/1986 | (JP) . |
| 62-137743 | 6/1987 | (JP) . |
| 62-203369 | 9/1987 | (JP) . |
| 62-235451 | 10/1987 | (JP) . |
| 62-235452 | 10/1987 | (JP) . |
| 62-2355451 | 10/1987 | (JP) . |
| 62-235775 | 10/1987 | (JP) . |
| 62-240736 | 10/1987 | (JP) . |
| 62-240738 | 10/1987 | (JP) . |
| 62-240739 | 10/1987 | (JP) . |
| 63-93877 | 4/1988 | (JP) . |
| 63-145771 | 6/1988 | (JP) . |
| 63-216378 | 9/1988 | (JP) . |
| 63-224050 | 9/1988 | (JP) . |
| 63-312975 | 12/1988 | (JP) . |
| 64-25934 | 1/1989 | (JP) . |
| 64-4938 | 1/1989 | (JP) . |
| 64-42857 | 2/1989 | (JP) . |
| 1-134426 | 5/1989 | (JP) . |
| 1-169751 | 7/1989 | (JP) . |
| 1-191829 | 8/1989 | (JP) . |
| 1-225737 | 9/1989 | (JP) . |
| 1-268062 | 10/1989 | (JP) . |
| 2-58742 | 2/1990 | (JP) . |
| 2-297737 | 12/1990 | (JP) . |
| 3-1338 | 1/1991 | (JP) . |
| 3-10709 | 2/1991 | (JP) . |
| 3-252929 | 11/1991 | (JP) . |
| 3-252930 | 11/1991 | (JP) . |
| 3-252932 | 11/1991 | (JP) . |
| 4-17670 | 1/1992 | (JP) . |

* cited by examiner

F I G. 7
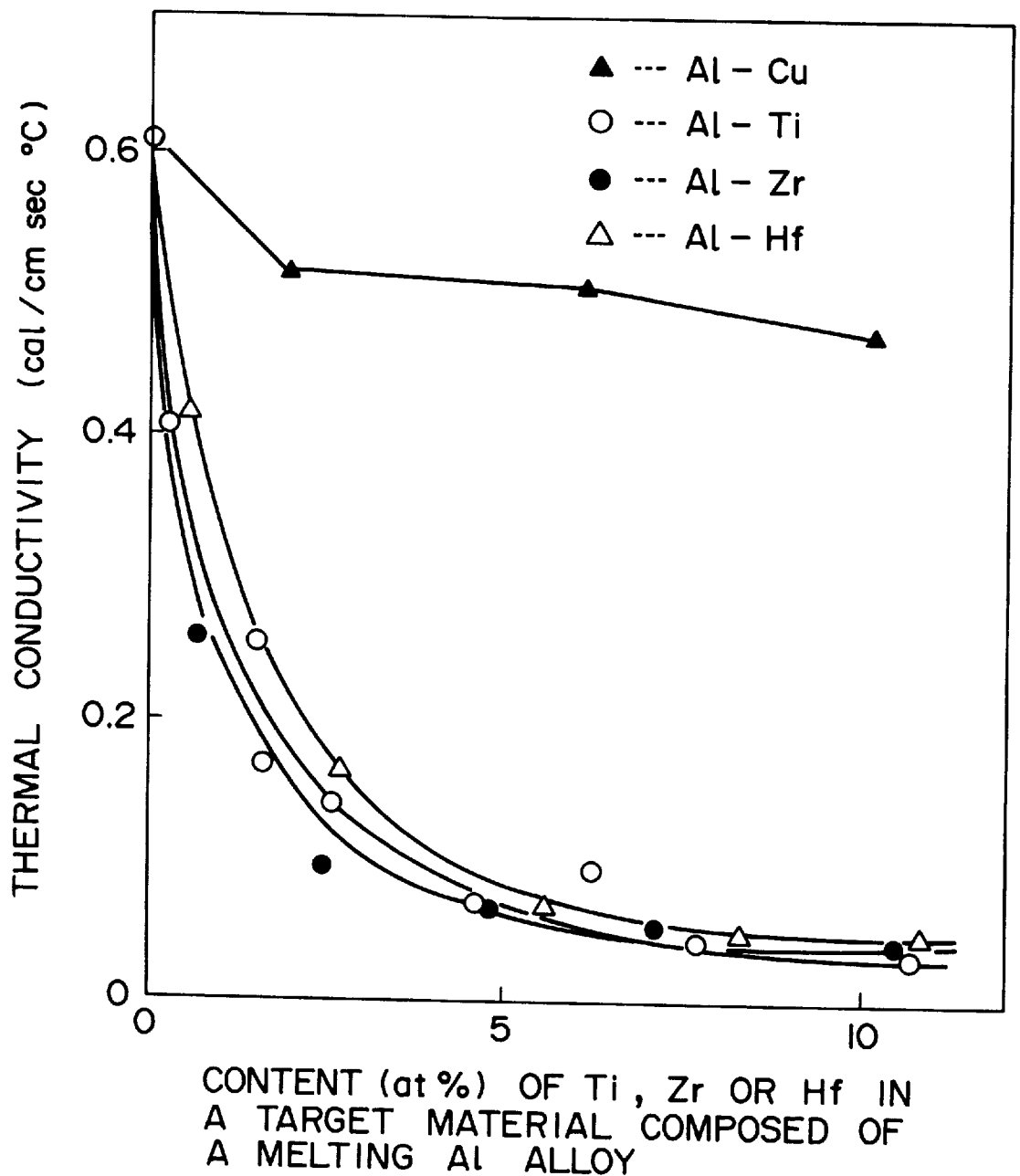

F I G. 14
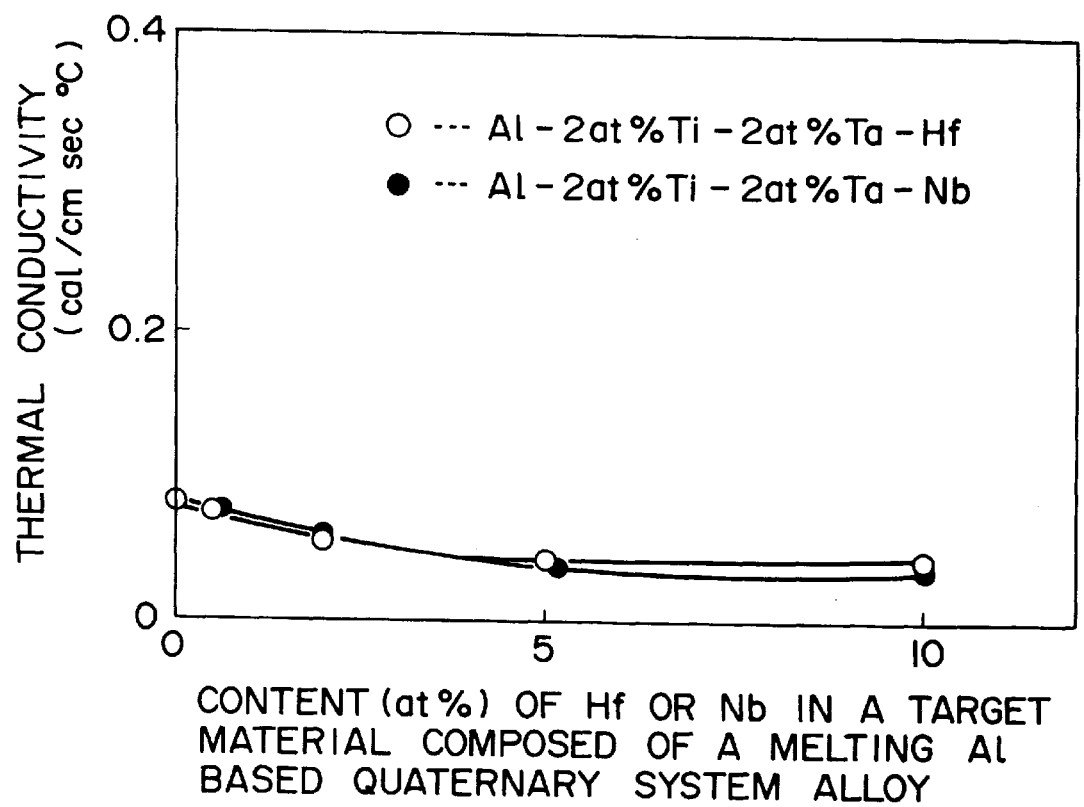

Al ALLOY FILMS AND MELTING Al ALLOY SPUTTERING TARGETS FOR DEPOSITING Al ALLOY FILMS

This application is a continuation of Ser. No. 08/888,784 filed Jul. 7, 1997 now Pat. No. 5,976,641 which is a division of Ser. No. 08/264,763 filed Jun. 23, 1994 now abandon, which is a continuation of Ser. No. 07/842,556 filed Feb. 27, 1992 abn.

BACKGROUND OF THE INVENTION

1. Field of the Invention

The present invention relates to Al alloy films and melting Al alloy sputtering targets for depositing the thin films, and particularly, to Al alloy films used as (1) shading films for liquid crystal display panels, solid state pickup devices (elements), etc., (2) reflection films for optical recording media such as magneto-optical disks, (3) Al alloy thin film line or electrode materials for semiconductor devices, and to (4) melting Al alloy sputtering targets for depositing the thin films.

2. Prior Art (1) Shading Films (1)-(a) Recently, there has been demanded a liquid crystal display panel with a large sized screen and high resolution. To meet the demand, active matrix system using 2-terminal or 3-terminal elements are in the development. Among them, those using thin film transistors (hereinafter referred to as TFT) have been mainly used as the large sized and high resolution liquid crystal display panels.

Such a liquid crystal display panel is obtained by partially forming a semiconductor area of a-Si, p-Si, etc. on a transparent insulating substrate of quartz, glass, etc., forming TFT's serving as switches inside the area, and forming display bodies such as electrodes and liquid crystals used as a display panel over them. In the above, the transparent substrate is disadvantageous in that the rays of light come into the semiconductor area, and a photo-excited current flows, which makes OFF operation insufficient. As a countermeasure for preventing the light from coming into the semiconductor area, there is used a method for depositing metal films (shading films) on the upper surface, on the lower surface or on both surfaces of the TFT area to shield the light. Such shading films are used not only for shielding the semiconductor area, but also for upgrading contrast by depositing the films into grid shaped narrow strips on the upper and lower sides of areas between respective picture elements.

Refractory metals such as Cr, etc. or colored resins have been used as the shading films. However, in such shading films for liquid crystal display panels, that is, shading films of a refractory metal or a colored resin, the reflectance is low so that the light is absorbed in the shading films, resulting in the increased temperature in the shading films. Particularly, in the metal films having high thermal conductivity, temperature is easily raised inside the light-shielded area (the surface close to a liquid crystal area inside the shading films) by the light irradiated on the outer surface of the shading films, so that the liquid crystal temperature is raised, an electrochemical reaction in the electrode interface of the liquid crystal is expedited and the TPT OFF current is increased, thereby causing a remarkable degradation in display qualities.

As a countermeasure therefor, high reflective shading films are used in place of the above-mentioned low reflective shading films. Au, Cu and Al are suitable for depositing the high reflective shading films, and particularly, Al is most suitable therefor because of inexpensiveness, excellent adhesion to a substrate and facility for etching. Therefore, there have been generally used pure Al films or Al-Si alloy films (Si content is small). However, such pure Al films or Al-Si alloy films are disadvantageous in that there occur hillocks due to the residual stress generated in the films during a depositing process or a laminating process, or due to heat history generated in manufacturing the liquid crystal display panel. Also, they have a tendency to easily produce pin holes so that, at the time of irradiation of the light, the light through the pin holes activates a TFT to thereby generate an erroneous electric signal. Furthermore, they are disadvantageous in that the temperature is raised at the time of irradiation of the light due to the high thermal conductivity, thereby degrading the display quality of the liquid crystal panel. Particularly, in the projection type liquid crystal display capable of displaying a large sized picture, which is developed actively in recent years, a strong light is irradiated by a halogen lamp, etc. in order to secure brightness, which makes the generations of erroneous electric signals and hillocks conspicuous.

(1)-(b) With the rapid progress of the image pickup ability, the solid state image pickup device (element) has been strongly required to enhance its performances furthermore. A sectional view of a conventional solid state image pickup element is shown in FIG. 17. Shading films 5 having light receiving windows in a matrix shape are deposited on a semiconductor substrate 1. The shading films 5 and a signal line 7 are often formed in the same process, so that the pure Al films or Al-Si alloy films have been generally used. In FIG. 17, reference numerals 2 is an N-type diffusion layer, 3 is an electrode, 4 is an insulating film between layers and 6 is an insulating film. A P-type silicon substrate is commonly used for the substrate 1.

However, the conventional shading films for the solid state image pickup element, that is, the pure Al films or Al-Si alloy films are disadvantageous in that heat transfer is generated in Al by the annealing (300 to 400° C.) for eliminating the surface level of the semiconductor substrate, to thereby generate hillocks on the shading films. When a hillock is protruded from the edge of a light receiving window toward the light receiving element side, the light receiving area of the light receiving element is made smaller than others' so that the sensitivity is lowered. Another disadvantage is to easily produce pin holes resulting in the erroneous electric signal.

(2) Reflection Films

High reflectance is required for reflection films on a substrate constituting a principal area of an optical recording medium such as an optical disk or a magneto-optical disk, so that pure Al films have been generally used. The pure Al films, however, are poor in corrosion resistance and have a disadvantage of being corroded when placed in air for a long time, to reduce the reflectance or generate pitting corrosion, thereby increasing the read error rate in the playback of information (signal).

As a countermeasure therefor, there have been proposed Al alloy films having various compositions, for example, Al alloy films containing Si, Pt or Pd. The proposed alloy films, however, are still insufficient in corrosion resistance to secure the long term reliability in the reproduction of information records in optical recording media. Further, at the film deposition, it is necessary to secure the homogeneity of alloy composition of the films. In order to achieve this purpose, a sputtering process is superior to a vapor deposition process. In the sputtering process, however, the film deposition rate is slow and it takes a longer time for film deposition in comparison with a vapor deposition process, which lowers the throughput in a film deposition process in mass production, and it can be an obstacle for improving the productivity. Therefore, the conventional Al alloy films have a disadvantage of requiring a long time for the film deposition resulting in the reduced productivity.

(3) Al Alloy Thin Film Line and Electrode Material for Semiconductor Devices (3)-(a) Al alloy thin films are used as the materials for the electrodes and lines of integrated circuits for general semiconductor devices (a semiconductor device in which elements are formed on a Si wafer), and which are divided broadly into two categories, pure Al and Al based alloys containing Si or Cu.

Pure Al is the most excellent material in the viewpoint of low electric resistivity. However, the pure Al has disadvantage of generating stress-migration (hereinafter referred to as SM) or electro-migration (hereinafter referred to as EM). SM is the swelling (hillock) and the disconnection (bad conduction) of the film line caused by stress, and which is mainly generated by heating. EM is the disconnection of film line caused by electric migrations, and which is mainly generated by current-carrying.

Al alloys containing Si or Cu have been developed for improving the above-mentioned disadvantages, but they are not sufficient in the resistance against SM and EM, and also in corrosion resistance. Accordingly, there has been desired the development of novel materials having higher reliability for semiconductor devices.

To obtain the novel material, further alloying can be considered. However, the alloying tends to increase in general the resistivity. On the other hand, the allowable upper limit of resistivity tends to be lowered by the miniaturization of line (miniaturization in width) accompanied with the higher degree of circuit integration in the recent semiconductor devices, and simple alloying exceeds the above-mentioned upper limit. Consequently, the development of a novel material for semiconductor devices are in a difficult situation.

(3)-(b) The materials for electrodes and lines of a TFT used for liquid crystal displays, etc. are, differently from the materials for the above-mentioned general semiconductor devices, heated up to a comparatively high temperature (about 400° C. or below 400° C.) in a manufacturing process of a TFT, so that Al based metal materials are poor in SM resistance. Consequently, refractory materials such as Ti, Cr, Mo, Ta, etc. are often used. However, there is a disadvantage that the resistivity is high, and the improvement is desired.

Recently, liquid crystal displays are getting to be larger in sizes for displaying larger pictures, and the line connecting between TFT elements (address line) is liable to be lengthened, and the resistance and capacitance are increased therewith so as to easily cause the delay of address pulses. As a result, the above-mentioned refractory metal materials are difficult to be used, and a novel refractory metal material having low resistivity is desired to be developed.

The resistivity of such line is desired to be lower than about 30 $\mu\Omega$cm, and the metals, Au, Cu and Al, satisfy the above-mentioned value. Among these metals, Au is difficult to be used because of expensiveness, Cu has a disadvantage in adhesion and in corrosion resistance. Al has a disadvantage in low melting point and in poor heat resistance, and is liable to occur the short circuits between layers (or between lines) or disconnections by SM. Accordingly, no one among them can be practically used.

Then, multilayer line (composite line), alloying of surface areas of line by ion implantation (surface alloyed line), etc. have been proposed. The multilayer line includes both a lower layer of a low resistance material and an upper layer of a high refractory material, to achieve a composite function of a lower layer (low resistivity) and an upper layer (SM resistance). The surface alloyed line is provided with the refractory layer on the surface area by ion-implantation of different elements into a low resistance material, to thus achieve a similar function to the above-mentioned multilayer line.

In the multilayer line, 2 times of film deposition processes must be performed, and in some combination of the upper and lower layers, the etching for forming a line pattern must be performed in a different process, to thereby increase the number of processes and to reduce the productivity. Meanwhile, the surface alloyed line needs a complicated process of ion implantation and is difficult in control of a surface alloyed layer, to thereby increase the number of processes and to reduce the productivity. Accordingly, there is desired the development of a novel metal material for a TFT which has no such disadvantages as mentioned above, that is, having low resistivity and being excellent in refractory.

(4) Sputtering Targets for Depositing Al Alloy Films

From the viewpoint of homogeneity of the alloy composition of films, the above-mentioned Al alloy films is preferably deposited by a sputtering process in comparison with a vapor deposition process. In the sputtering process, following sputtering targets have been used: (a) a small piece of a metal (alloy component) such as Cr is placed on a pure Al target; (b) blocks of a pure Al and alloy component are disposed in a mosaic pattern; and (c) powder of a pure Al and alloy component are mixed and sintered.

In the cases of (a) and (b), since there is a difference in the sputtering yield and the radiation angle between an Al and alloy component, the composition of the obtained Al alloy films becomes smaller than that of the target (area ratio between an Al and alloy component), and the difference varies according to the conditions of sputtering or to the devices. Therefore, it is difficult to control the composition of Al alloy films, and since the above-mentioned area ratio varies continuously during the usage of a target material, Al alloy films of a specified composition is difficult to be obtained. In the case of (c), since an Al powder comparatively differs from an alloy component powder in the specific gravity, it is difficult to mix them homogeneously and hence to obtain the homogeneous composition of a target material, so that the Al alloy film composition is liable to be inhomogeneous. Furthermore, the above-mentioned both powders are active and tend to absorb oxygen strongly, so that the Al alloy films contain much oxygen thereby degrading the reflectance and also increasing the electric resistivity.

SUMMARY OF THE INVENTION

It is therefore an object of the present invention to provide Al alloy films having such a function as solving the above-mentioned disadvantages, adapted to be used as (1) shading films having high reflectance, good adherence, facility for etching, an excellent resistance against hillock, low thermal conductivity, high corrosion resistance, and an excellent resistance against pin holes;

(2) reflection films having high reflectance, high corrosion resistance, and excellent productivity with high film deposition rate in sputtering;

(3) materials for semiconductor devices (thin film line and electrodes) having high refractory (refractory against SM, etc.), refractory against EM, high corrosion resistance, and low electric resistivity, for use in general semiconductor devices and TFT's without lowering productivity to cope with the narrowing of line width, with the higher degree of circuit integration of semiconductor devices, and with the lengthening of address line in TPT's accompanied with the development of larger picture sized liquid crystal display; and (4) melting Al alloy sputtering targets for depositing the above-mentioned films.

To achieve the above-mentioned objects, according to the present invention, there are provided Al alloy films and melting Al alloy sputtering targets for depositing the Al alloy films as described in the following.

In claim 1 of the present invention, there is provided a Al alloy film comprising an Al alloy containing one kind or two or more kinds of alloy components selected from a group of Ti, Zr, Hf, V, Nb, Ta, Cr. Mo and Mn in a total amount of 0.1 to 10 at %.

In claim 2 of the present invention, there is provided an Al alloy film defined in the first embodiment, adapted to be used as a reflection film for an optical recording medium, or as a shading film for a liquid crystal display panel or a solid state image pickup device.

In claim 3, there is provided an Al alloy film defined in claim 1, adapted to be used as an Al based ally thin film line or electrode material for a semiconductor device.

In claim 7, there is provided a sputtering target comprising a melting Al based alloy containing one kind or two or more kinds of alloy components selected from a group of Ti, Zr, Hf, V, Nb, Ta, Cr, Mo and Mn in a total amount of 0.1 to 10 at %, wherein the intermetallic compounds between Al and the alloy components are homogeneously distributed in the Al matrix.

In claim 8, there is provided a melting Al alloy sputtering target for depositing the film defined in claim 7, wherein the above-mentioned intermetallic compounds are needle-shaped and the lateral length of them are shorter than 200 μm.

In claim 9, there is provided a melting Al alloy sputtering target for depositing the film defined in claims 7 and 8, wherein the oxygen content in the melting Al alloy is lower than 400 ppm.

BRIEF DESCRIPTION OF THE DRAWINGS

Other objects and aspects of the invention will be become apparent from the following description of embodiments with reference to the accompanying drawings:

FIG. 7 is a diagram showing the relation between the content of Cu, Ti, Zr or Hf in a sputtering target material of a melting Al alloy according to the example 3 and the thermal conductivity of the shading films obtained from the sputtering of the target material;

FIG. 14 is a diagram showing the relation between the content of Hf or Nb in a sputtering target material of a melting quaternary system Al alloy according to the Example 6 and the thermal conductivity of the films;

DETAILED DESCRIPTION OF THE PREFERRED EMBODIMENTS

Figure 1:
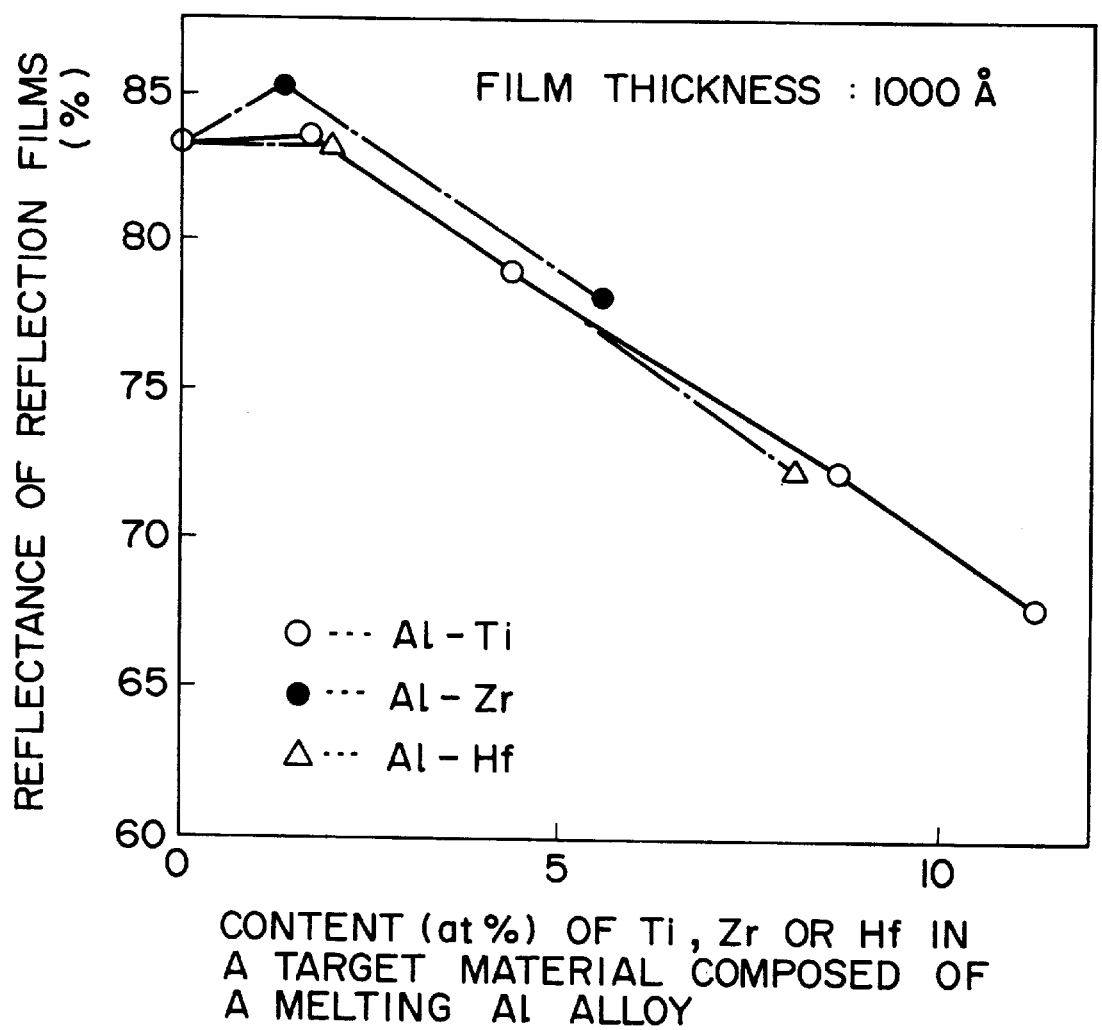
FIG. 1 is a diagram showing the relation between the content of Ti, Zr or Hf in a sputtering target material comprising a melting Al alloy according to the Example 1 and the reflectance of the reflection films obtained from the sputtering of the target material.

The exemplary embodiments according to the present invention will be described with reference to the drawings.

First, there were manufactured Al alloy sputtering targets comprising Al containing various kinds of elements. Next, with the use of the above targets, many kinds of Al alloy shading films were deposited by a sputtering process. Then, the following characteristics were investigated: the characteristics required for shading films such as the composition, reflectance, corrosion resistance, resistance against hillock, adherence, thermal conductivity, or etching property; the characteristics required for a semiconductor material (Al alloy line and electrode materials) such as refractory (resistance against SM, etc.), and resistance against EM etc.; and the characteristics required for reflection films. As the result, it was found that the addition of Ti, Zr, Hf, V, Nb, Ta, Cr, Mo and Mn to Al was most effective for the improvement of the above-mentioned characteristics, and also that Al alloy films containing these elements have excellent characteristics as shading films, reflection films and semiconductor materials.

(1) Since an Al alloy film according to the present invention comprises an Al alloy containing one kind or two or more kinds of alloy components selected from a group of Ti, Zr, Hf, V, Nb, Ta, Cr, Mo and Mn (hereinafter referred to as Ti, etc.) in a total amount of 0.1 to 10 at %, it achieves the characteristics of Al or of an Al alloy, and at the same time has high reflectance, good adhesion and excellent etching characteristics.

In addition of Ti, etc. to Al, with the increase in the added amount, resistance against hillock and corrosion resistance are upgraded and thermal conductivity becomes low. Therefore, the Al alloy film according to the present invention has excellent in the resistance against hillock and low thermal conductivity, and further is excellent in corrosion resistance which prevents the occurrence of pin holes in the film. In this case, it is necessary to control the added amount (content) of Ti, etc. to be in the range of 0.1 to 10 at % in a total amount. The reasons are as mentioned below.

When the content of Ti, etc. is less than 0.1 at %, resistance against hillock and corrosion resistance are insufficient and thermal conductivity is not sufficiently low. When the content of Ti, etc. is more than 10 at %, the reflectance is lowered and the alloy tends to absorb heat easily by the radiation of the light and also etching becomes difficult. In the case of wet etching, in particular, when the total amount of alloy components is more than 10 at %, etching residue is produced and perfect etching cannot be performed.

As described in the above, the Al alloy film according to the present invention has high reflectance, good adhesion, easy etching property, excellent resistance against hillock, low thermal conductivity, excellent corrosion resistance, and property to suppress pin holes, to thereby achieve the excellent characteristics as a shading film.

(2) The Ti, etc. containing Al alloy film has high reflectance, excellent corrosion resistance, and high film deposition rate in sputtering, namely, high productivity, to thereby achieve excellent characteristics as a reflection film. In this case, when the amount of Ti, etc. is less than 0.1 at %, the progress of film deposition rate is almost not observed. When the amount of Ti. etc. is more than 10 at %, the lowering of reflectance and the occurrence of read errors can be observed. Accordingly, the total amount of Ti, etc. is limited within the range of 0.1 to 10 at %.

(3) In the Ti, etc. containing Al alloy film, refractory (resistance against SM, etc.) and resistance against EM are upgraded. These characteristics are better than those of the conventional pure Al or Al alloy containing Si or Cu, and are in a similar level to those of refractory metal materials such as Ti, Cr, Mo, Ta, etc. The electric resistivity is improved to be lower than about 30 $\mu\Omega$cm, and the corrosion resistance is better than that of a pure Al. Further, it can be manufactured in a similar way to that of the conventional Al alloy film containing Si, etc., so that there is no fear to lower productivity which occurs in the case of composite line or in the case of surface alloyed line by ion implantation.

Therefore, the Al alloy film can exhibit excellent functions as thin film line or electrode material for a semiconductor device. In this case, when the amount of Ti, etc. is less than 0.1 at %, resistance against SM and corrosion resistance are insufficient. When the amount of Ti, etc. is more than 10 at %, electric resistivity becomes higher than about 30 $\mu\Omega$cm. Consequently, the content of Ti, etc. is limited within the range of 0.1 to 10 at %.

(4) An optimum ratio of added components differs a little by uses intended by the present invention, as explained in the following.

When one kind or two or more kinds of alloy components selected from a group of Ti, Cr and Ta are added to Al, the obtained alloy film has particularly excellent resistance against hillock, low thermal conductivity, excellent corrosion resistance, and property to suppress pin holes, thus being preferably usable as a shading film for a liquid crystal display panel or for a solid state image pickup device.

When one kind or two or more kinds of alloy components selected from a group of Ti, Ta, Mn, Cr and Zr are added to Al, the obtained alloy film is excellent in refractory (resistance against SM, etc.), in resistance against EM, and in corrosion resistance, and also low in electric resistivity to be 10 $\mu\Omega$cm or less, thus being preferably usable for general semiconductor devices and for TFT's. Furthermore, it can cope with the narrowing of line width accompanied with the development to higher degrees of circuit integration of semiconductor devices in recent years, and it also can cope with the lengthening of address line of TFT's accompanied with the development toward larger screen sizes of liquid crystal display panels.

Mn does not influence upon the film deposition rate in sputtering, so that the productivity of an Al alloy film containing Mn is similar to that of the pure Al film. Since the difference between the melting points of Al and Mn is comparatively small, the control of melting and melting metal composition are easier in comparison with the case where a transition element of IVa or Va group is added, and therefore, the homogeneity in composition of a melting Al alloy target is excellent, which makes it possible to stably obtain an Al alloy film of a specified composition and of an excellent homogeneity in composition.

Therefore, an Al alloy film containing Mn has high reflectance, high corrosion resistance, and low thermal conductivity, and also it is excellent in homogeneity of composition and in productivity.

When, besides Mn, one kind or two or more kinds of alloy components selected from a group of Hf and Ta (hereinafter referred to as Hf, etc.) are added, the film deposition rate in sputtering is remarkably improved. In addition, the effect of Hf and Ta can be also obtained by using Ti, Zr, V, Nb, Cr and Mo, besides Mn.

(5) The melting Al alloy sputtering target for depositing thin films according to the present invention is, as mentioned in the above, a melting Al alloy containing one kind or two or more kinds of alloy components selected from a group of Ti, Zr, Hf, V, Nb, Ta, Cr, Mo and Mn (Ti, etc.) in a total amount of 0.1 to 10 at %. That is, the above-mentioned Al alloy is manufactured through the processes of melting and casting, so that part of the Ti, etc. is dissolved in a solid solution in the Al matrix, and most of them exist in the state of intermetallic compound with Al. The distribution of Ti, etc. in a solid solution is homogeneous, and the intermetallic compound is also homogeneously distributed. Such a homogeneously distributed state can be obtained easily. Thereby, the Ti, etc. is homogeneously distributed in an Al alloy, thus forming a target material containing Ti, etc. homogeneously distributed in the Al matrix.

Since such a target material has a homogeneous composition, the change in the composition with time during operation does not occur, and also since the sputtering yield is a constant, the composition of a target almost is identical to that of an alloy film obtained from the target. Therefore, it is easy to adjust the composition of an alloy film, and consequently an alloy film having a specified composition can be stably obtained. The above-mentioned target material is manufactured through a melting process, so that the oxygen content can be controlled in a low level, to thereby secure an alloy film of low oxygen content and of high reflectance.

Figure 2:
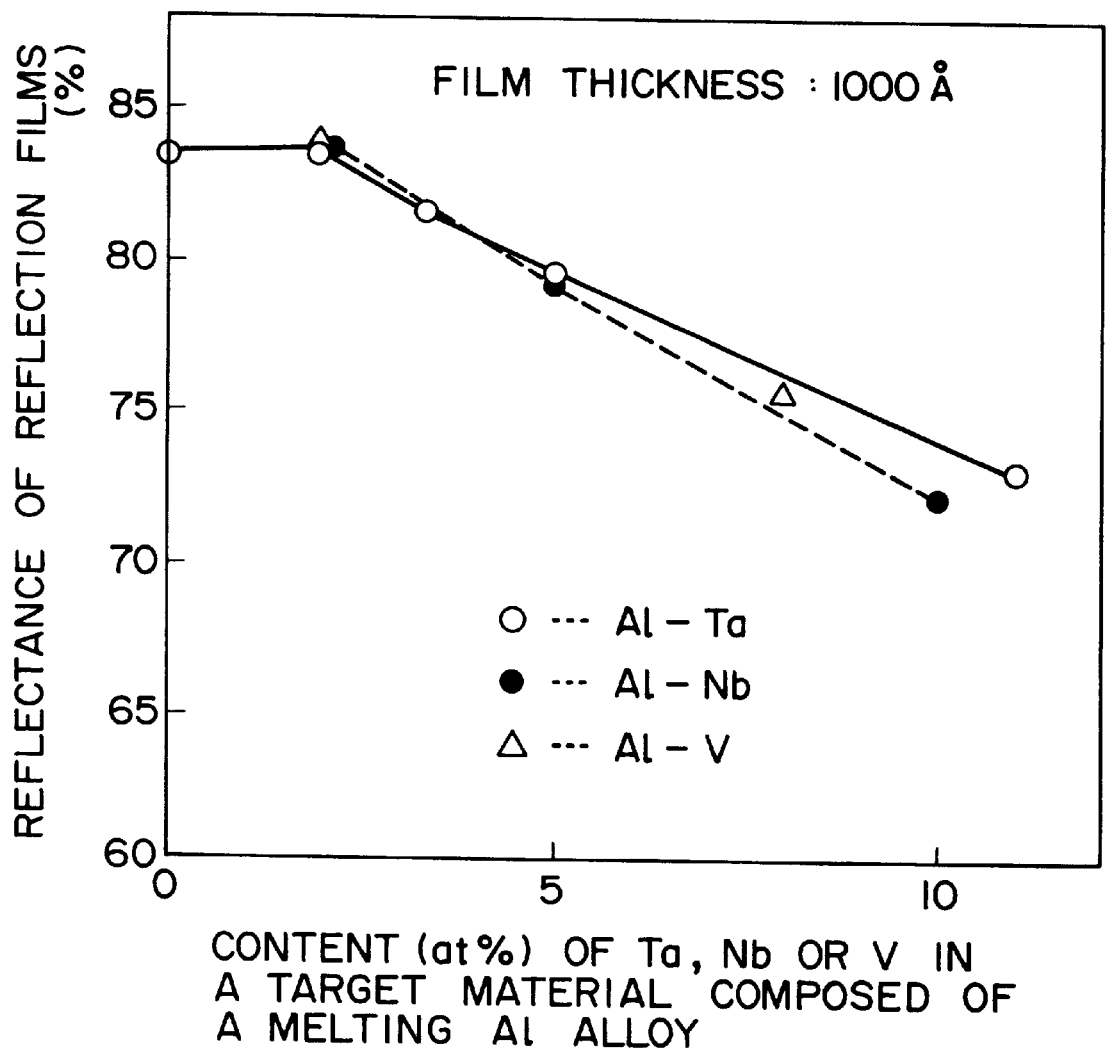
FIG. 2 is a diagram showing the relation between the content of Ta, Nb or V in a sputtering target material of a melting Al alloy according to the Example 1 and the reflectance of the reflection films.

The reasons why the content of Ti, etc. is limited in the range of 0.1 to 10 at % is similar to the reasons for limiting the content of alloy components in the above-mentioned Al alloy film. When the content is less than 0.1 at %, the effect of improving corrosion resistance is small, and when the content is more than 10 at %, the necessary reflectance of more than 70% cannot be secured as shown in FIGS. 1 and 2.

When the oxygen content of a melting Al based alloy is more than 400 ppm, the reflectance starts to be lowered, so that it is desirable to limit the oxygen content less than 400 ppm.

When the sizes of the intermetallic compound are larger than 200 μm, the alloy film composition is different from that of the target alloy, but when the sizes are smaller than 200 μm, the above-mentioned difference almost disappears and the alloy film composition can be easily adjusted.

In order to make the size of the intermetallic compound less than 200 μm, there may be rapidly cooled the molten metal obtained by a melting method in which Al and Ti, etc. are homogeneously mixed. There are several methods of rapid cooling: molten metals are cast in a water cooled copper mold or in a mold having a large cooling capacity; molten metals are continuously cast in a water cooled mold: molten metals are poured between two rotating rollers to produce thin plates; or molten metals are atomized by an inert gas

EXAMPLE 1

An alloy of 4 kg was molten by induction heating in vacuum and was then cast in a water cooled copper mold, to obtain a binary system Al alloy ingot containing Ti, Zr, Hf, V, Nb, Ta, Cr, Mo and Mn in amounts of 0.2 to 10 at %, respectively. Subsequently, by using the ingot, a sputtering target was picked from the ingot and Al alloy films (reflection films) of 1000 Å thickness were deposited on transparent polycarbonate resin substrates having the thickness of 1.2 mm by a DC magnetron sputtering process. Samples were prepared by applying protection films (10 μm thick) of acrylic resin over the reflection films by spin coating.

Figure 3:
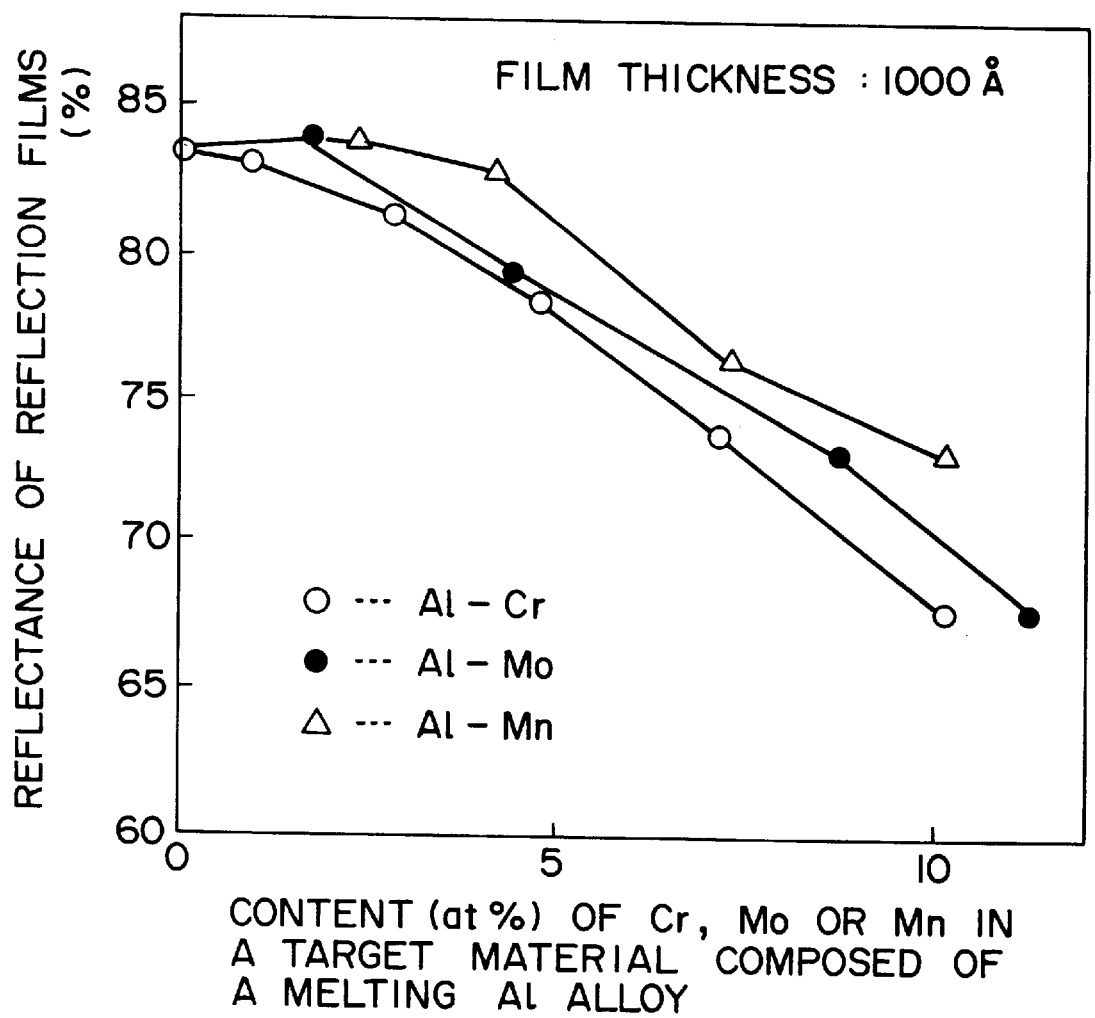
FIG. 3 is a diagram showing the relation between the content of Cr, Mo or Mn in a sputtering target material of a melting Al alloy according to the Example 1 and the reflectance of the reflection films.

The reflectance of the above-mentioned samples were measured from the side thereof with use of a laser beam having a wavelength of 780 nm. The results are shown in FIGS. 1 to 3. In all alloy films, the reflectance thereof was decreased with the increase in the amount of added elements (contents). However, they showed high reflectance (initial reflectance) of more than 70% so far as the contents were less than 10 at %.

EXAMPLE 2

Figure 4:
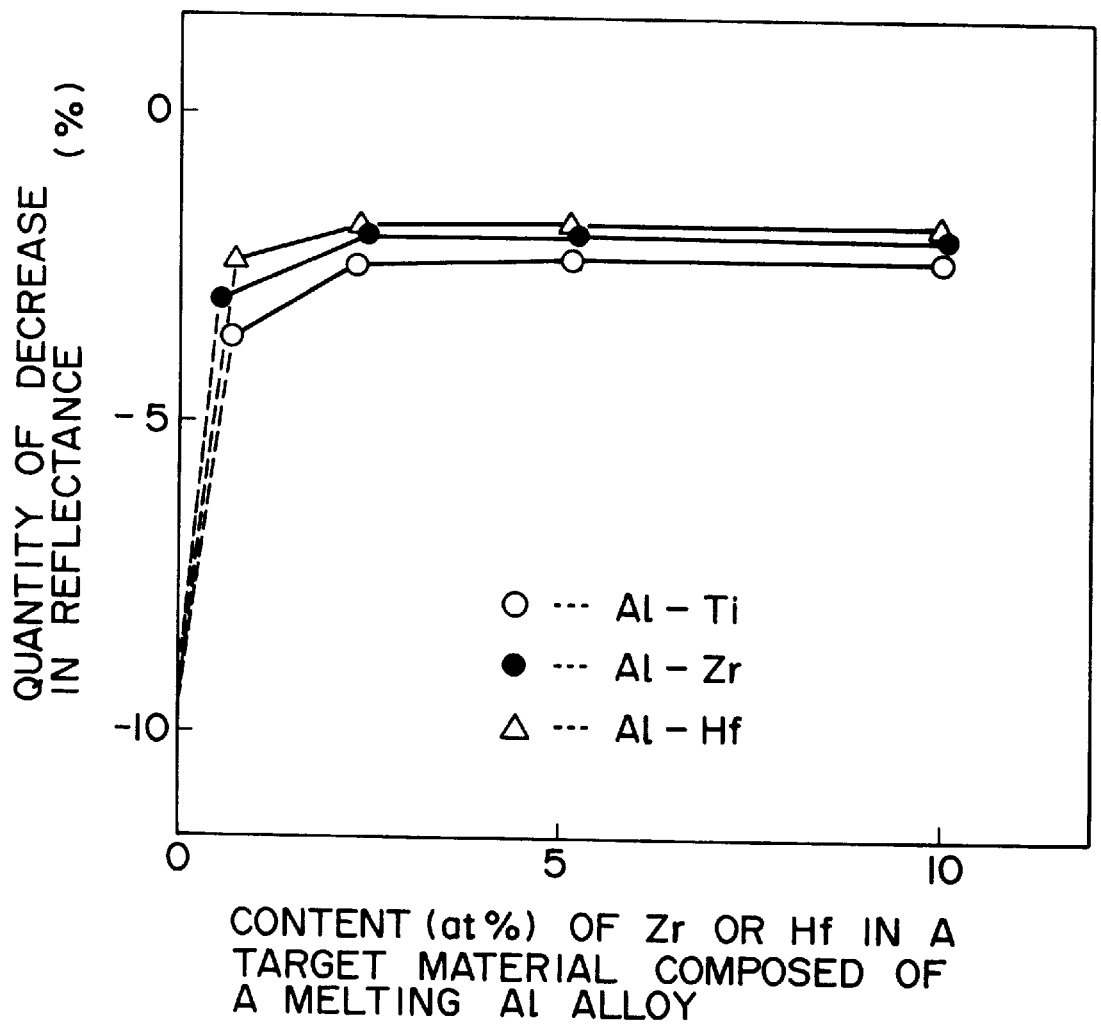
FIG. 4 is a diagram showing the relation between the content of Ti, Zr or Hf in a sputtering target material of a melting Al alloy according to the example 2 and the quantities of decrease in the reflectance of the reflection films.
Figure 5:
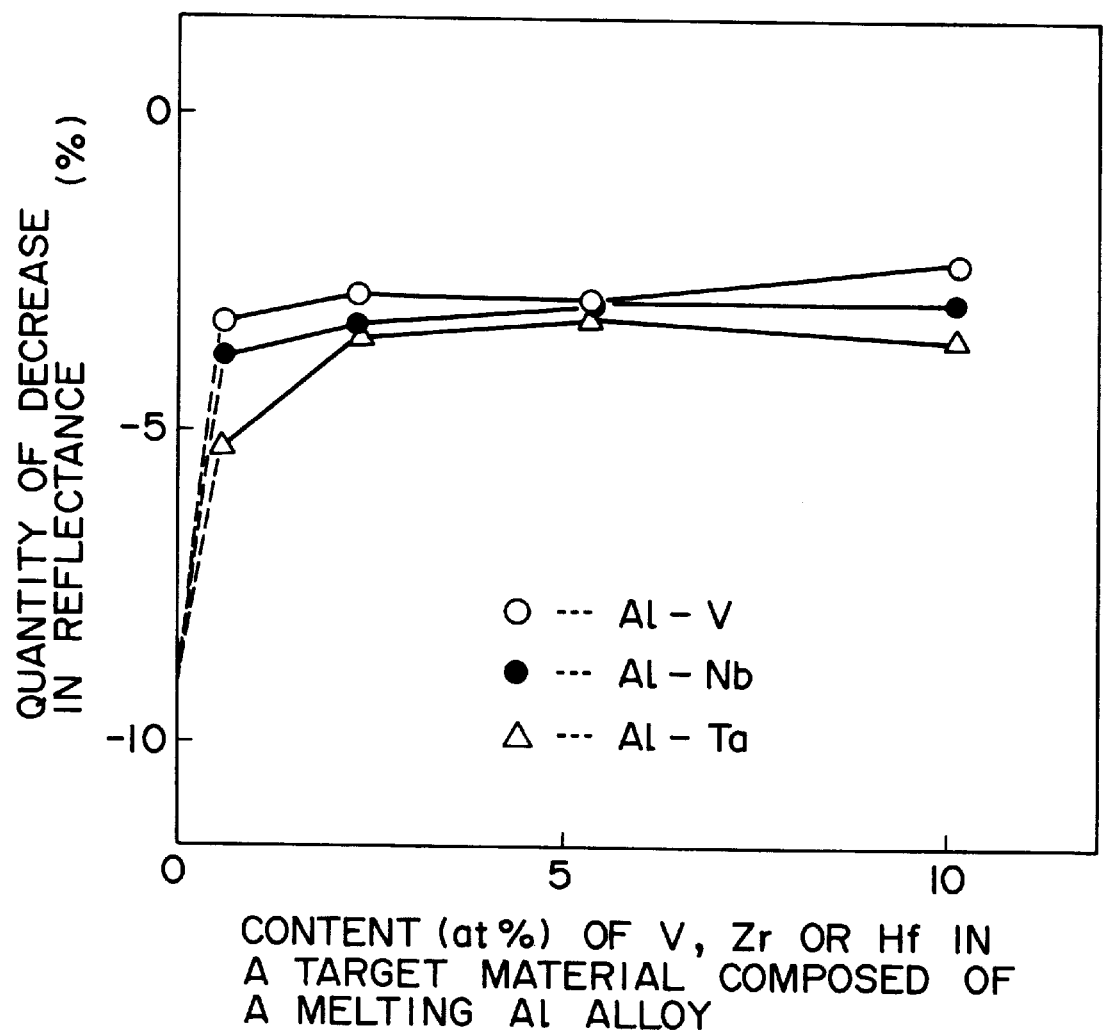
FIG. 5 is a diagram showing the relation between the content of V, Zr or Hf in a sputtering target material of a melting Al alloy according to the Example 2 and the quantities of decrease in the reflectance of the reflection films.
Figure 6:
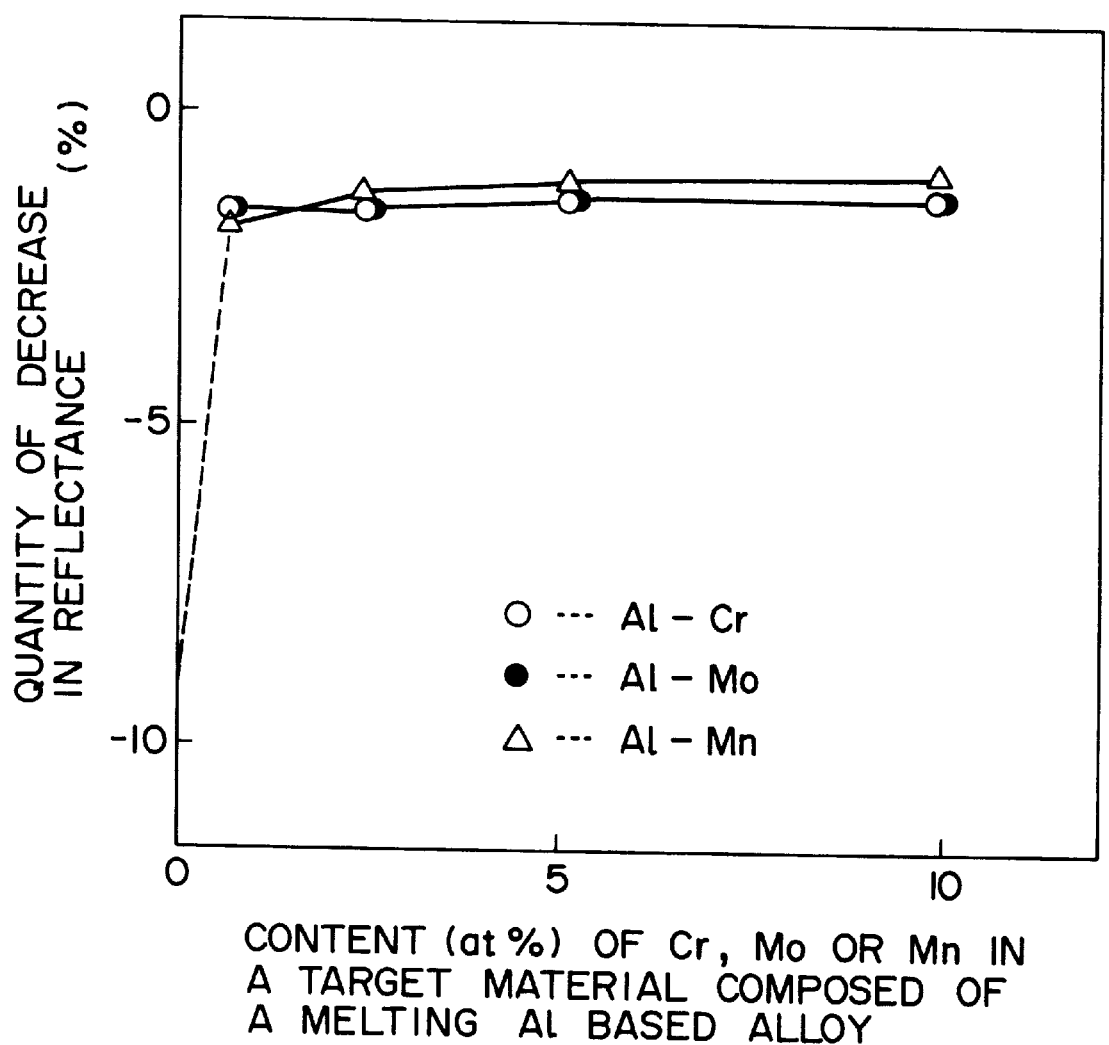
FIG. 6 is a diagram showing the relation between the content of Cr, Mo or Mn in a sputtering target material of a melting Al alloy according to the example 2 and the quantities of decrease in the reflectance of the reflection films.

As for the samples obtained in the example 1, a PCT (Pressure Cooker Test) was carried out at 105° C., at 1.2 atm and in related humidity of 100% to evaluate the corrosion resistance of reflection films based on the quantity of decrease in reflectance (decreasing factor). There are shown, in FIGS. 4 to 6, the quantities of decrease in reflectance during 30 hours after the start of the PCT. The quantity of decrease in reflectance was remarkably improved by the addition of Ti, Zr, Hf, V, Nb, Ta, Cr, Mo and Mn. It shows that the samples are excellent in corrosion resistance.

EXAMPLE 3

Figure 8:
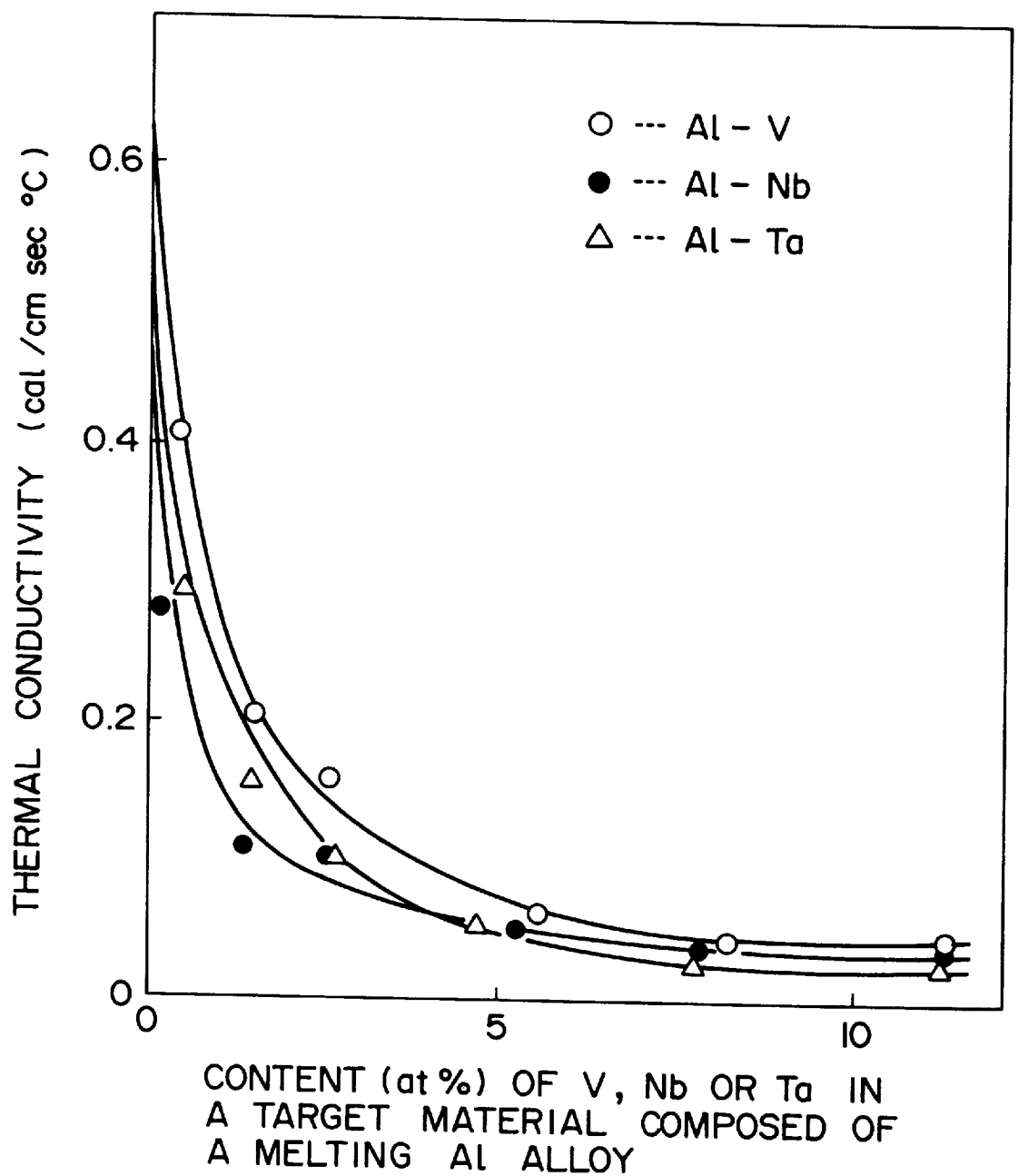
FIG. 8 is a diagram showing the relation between the content of V, Nb or Ta in a sputtering target material of a melting Al alloy according to the example 3 and the thermal conductivity of the shading films.
Figure 9:
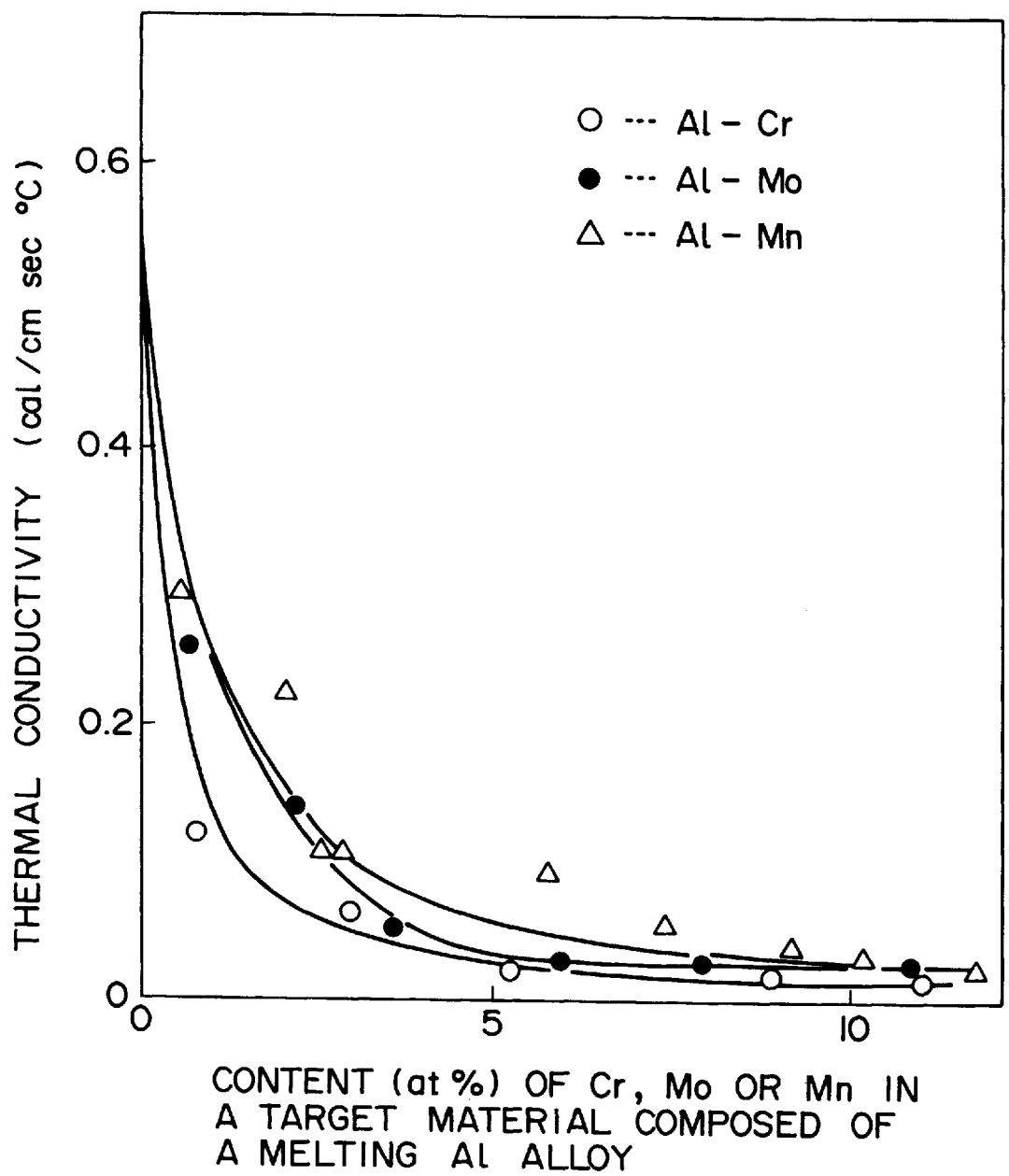
FIG. 9 is a diagram showing the relation between the content of Cr, Mo or Mn in a sputtering target material of a melting Al alloy according to the example 3 and the thermal conductivity of the shading films.

Al alloy films of 10 μm thickness (shading films) were deposited using a similar target and by a similar sputtering process to those in the example 1. As for these samples, thermal conductivity of shading films was measured by AC calorimetric method. The results are shown in FIGS. 7 to 9. The thermal conductivity is remarkably lowered by the addition of Ti, Zr, Hf, V, Nb, Ta, Cr, Mo and Mn. The lowering effect is larger in a film state, differently from that in a bulk state.

As a comparative example, a similar measurement was made about an Al-Cu alloy film, and the result showed that a lowering tendency of the thermal conductivity in a film state was similar to that in a bulk state, and the remarkable lowering in thermal conductivity was not observed.

EXAMPLE 4

Figure 10:
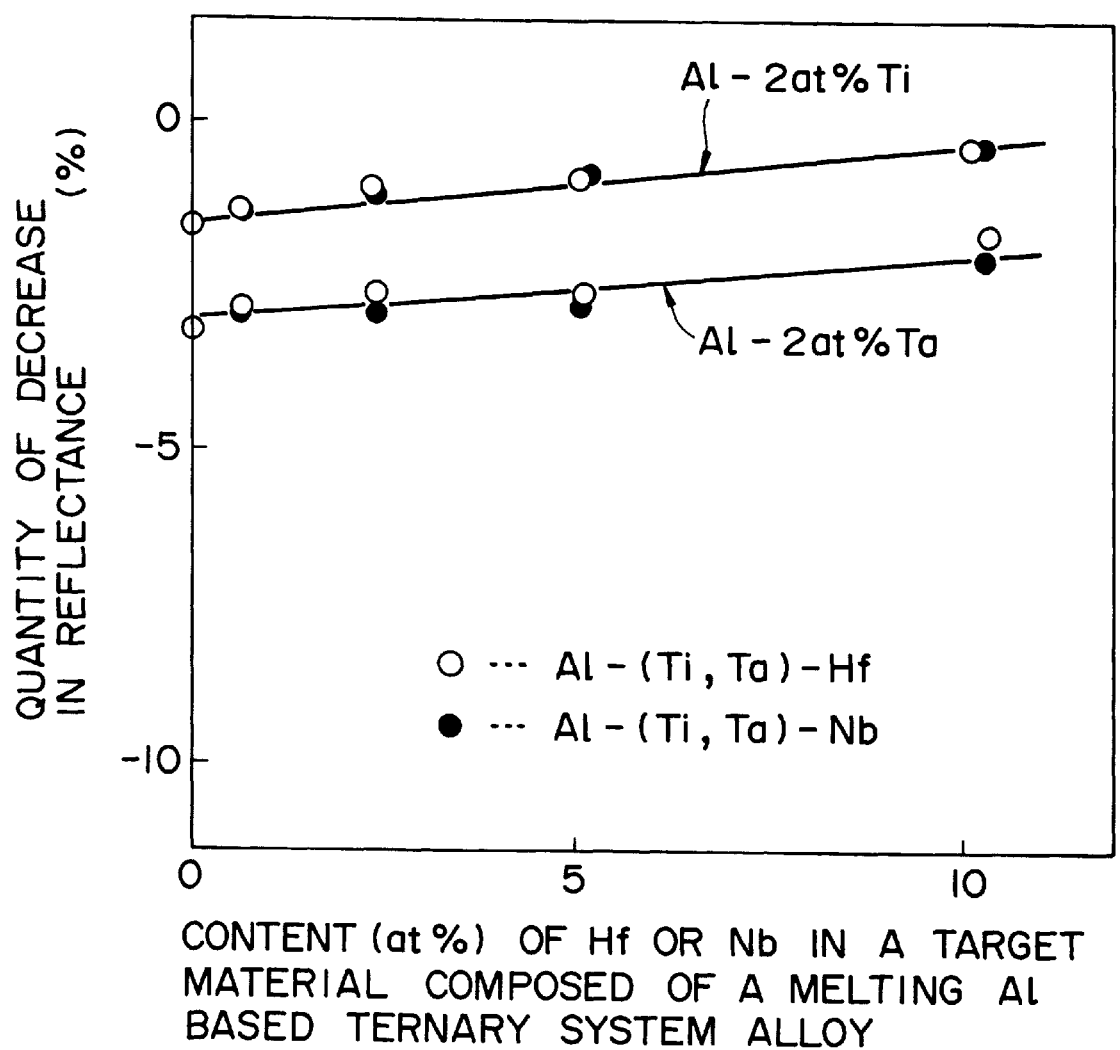
FIG. 10 is a diagram showing the relation between the content of Hf or Nb in the sputtering target material of a melting ternary system Al alloy according to the example 4 and the quantities of decrease in the reflectance of the films.

Among the above-mentioned binary system Al alloys, an Al-2 at % Ti alloy and an Al-2 at % Ta alloy were selected as typical examples, and Hf or Nb containing ternary system Al alloy films were deposited and are subjected to a similar PCT as in the example 2. The results are shown in FIG. 10. By further addition of Hf or Nb, the quantity of decrease in reflectance showed a tendency to lower, thus improving corrosion resistance.

This example show one of corrosion resistance of ternary system Al alloy-films. Since the effect of an added element on the corrosion resistance has an additive property, the above-mentioned results hold true in all combinations of added elements.

EXAMPLE 5

Figure 11:
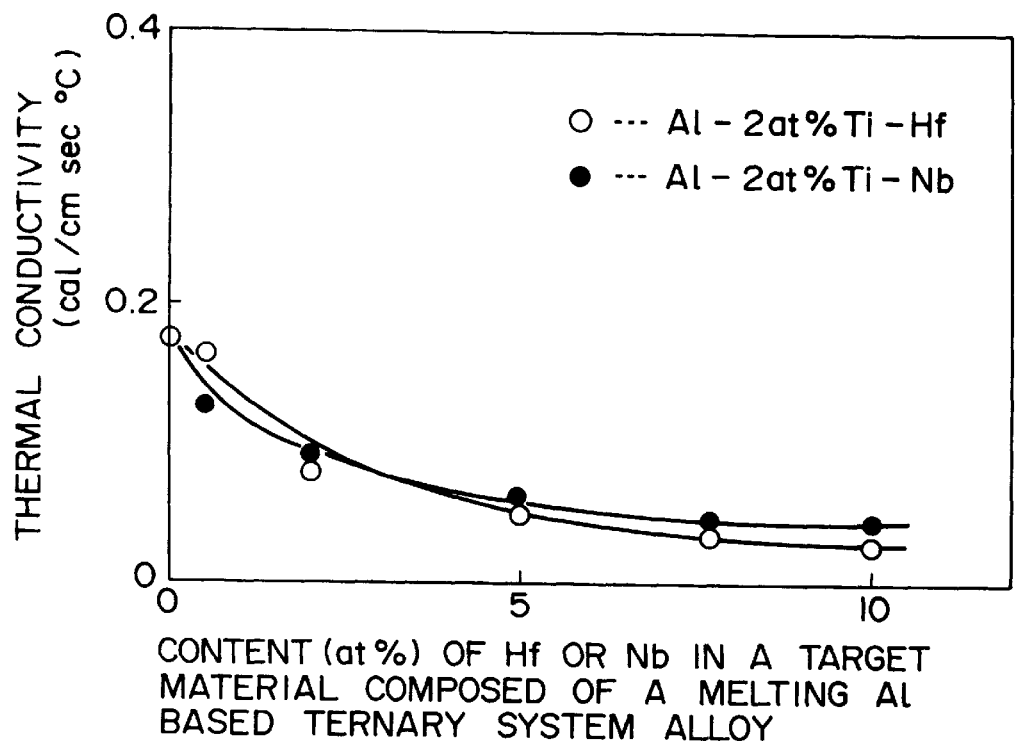
FIGS. 11 and 12 are diagrams each showing the relation between the content of Hf or Nb in a sputtering target material of a melting ternary system Al alloy according the example 5 and the thermal conductivity of the films.
Figure 12:
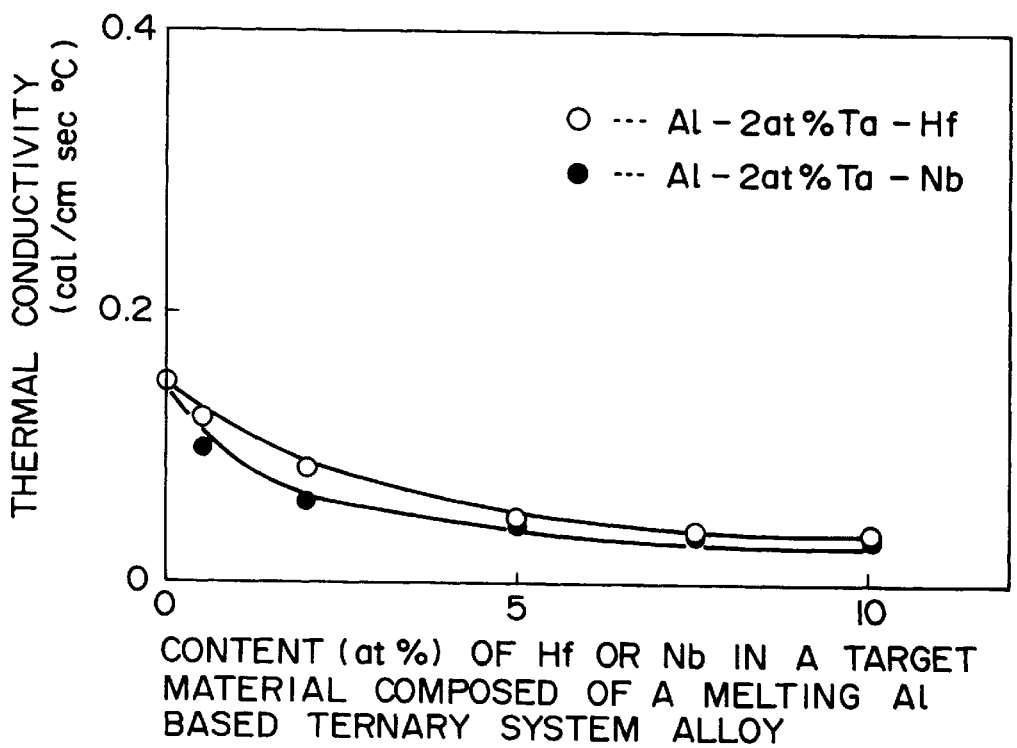

As for ternary system Al alloy films described in the example 4, thermal conductivity of shading films was measured by AC calorimetric method in a similar way to the case of the Example 5. The results are shown in FIGS. 11 and 12. When Hf or Nb is further added to Al-2 at % Ti alloy or Al-2 at % Ta alloy, the thermal conductivity showed a tendency to decrease further. The effect of adding such as Hf or Nb is constant independent of kinds of the binary system Al alloys (kinds and contents of alloyed elements), and the effect is not influenced by the kinds of Al alloys.

EXAMPLE 6

Figure 13:
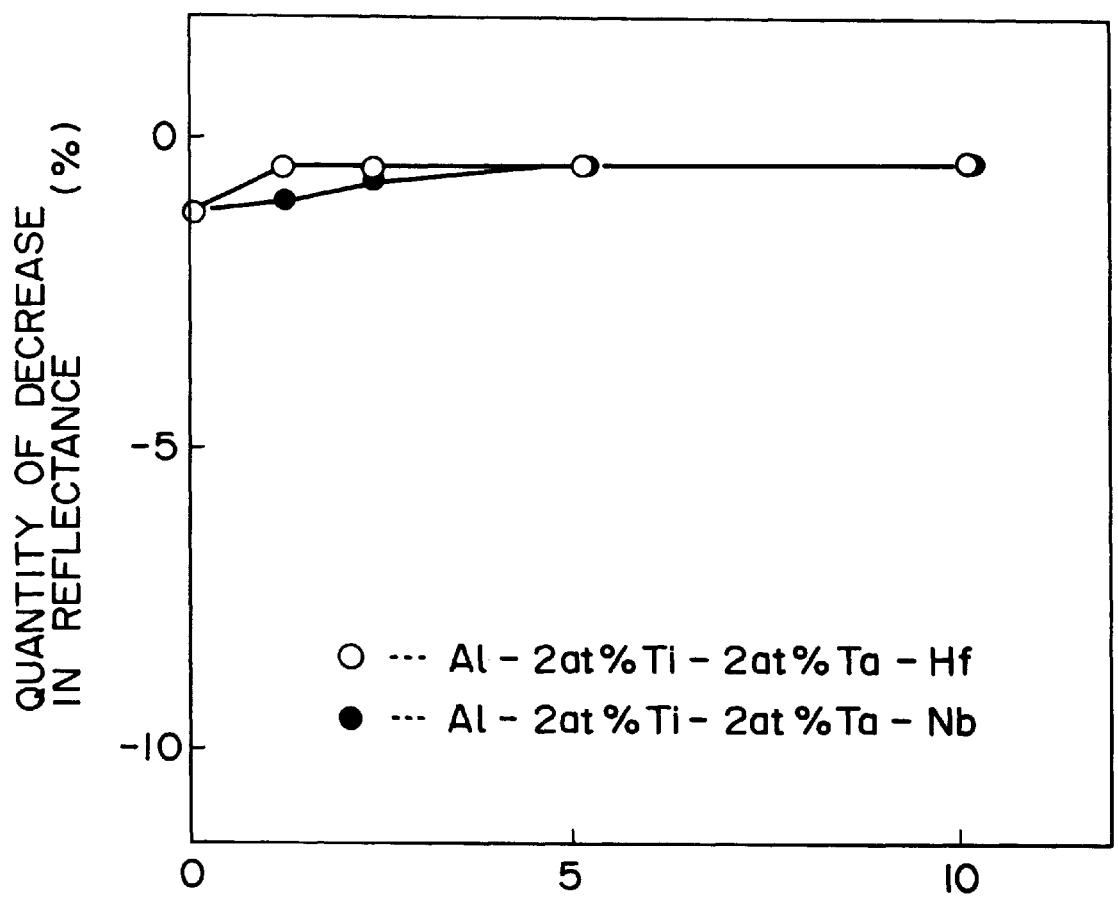
FIG. 13 is a diagram showing the relation between the content of Hf or Nb in a sputtering target material of a melting quaternary system Al alloy according to the Example 6 and the quantity of decrease in the reflectance of the films.

There were deposited the films of quaternary system Al alloy obtained by adding further Hf or Nb to an Al-2 at %-2 at % Ta alloy and a PCT and thermal conductivity measurement were carried out in a similar way as in the Examples 2 and 3. The results are shown in FIGS. 13 and 14. The thermal conductivity showed a tendency to decrease with the increase in the added amount of Hf or Nb.

EXAMPLE 7

Figure 15:
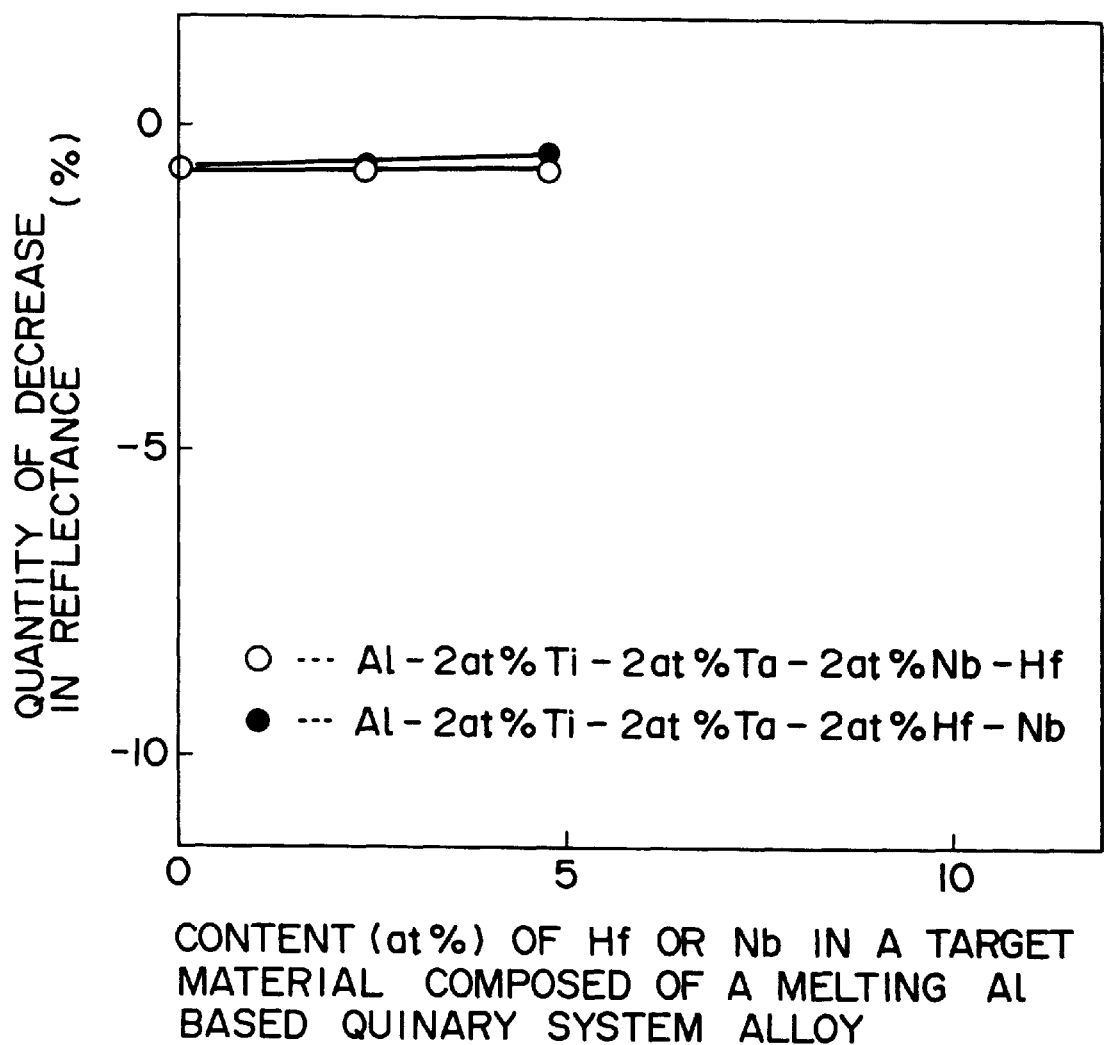
FIG. 15 is a diagram showing the relation between the content of Hf or Nb in a sputtering target material of a melting quinary system Al alloy according to the example 7 and the quantity of decrease in the reflectance of the films.
Figure 16:
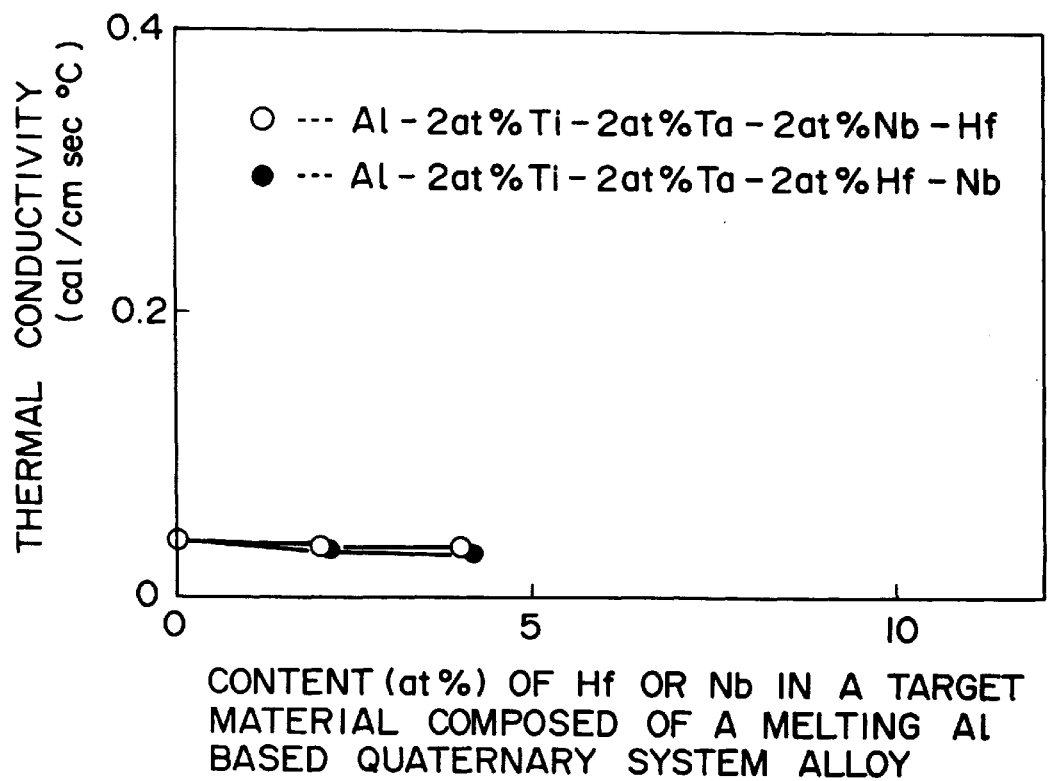
FIG. 16 is a diagram showing the relation between the content of Hf or Nb in a sputtering target material of a melting quinary system Al alloy according to the example 7 and the thermal conductivity of the films.
Figure 17:
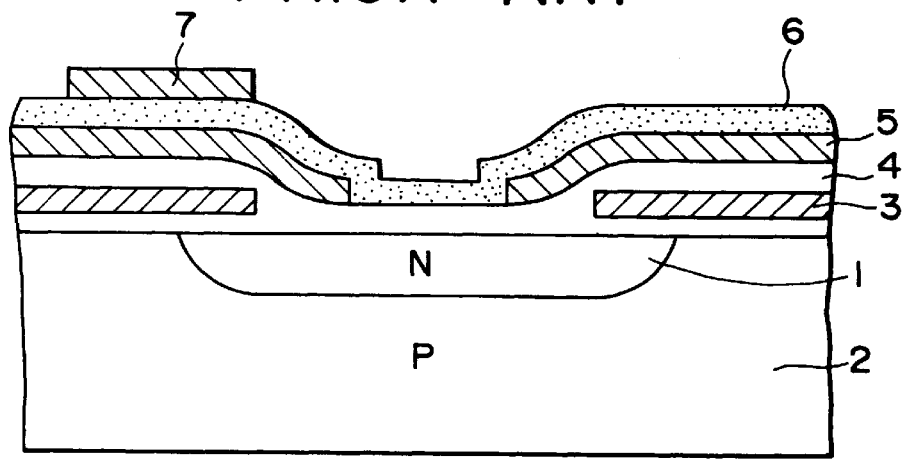
FIG. 17 is a sectional view showing the principal are of a conventional solid state image pickup device (element).

There were deposited the films of quinary system Al alloy films obtained by adding further Hf and Nb to an Al-2 at %-2 at % Ta alloy, and a similar measurement was carried out as in the example 6. The results are shown in FIGS. 15 and 16. The change in thermal conductivity with the increase in the added amount of Hf and Nb was small.

COMPARATIVE EXAMPLE 1

After the mixing of a pure Al powder and Ti powder with a V mixer, the mixture was sintered at 450° C. by HIP method, to prepare a sputtering target material comprising binary system Al group sintered material containing 2 at % of Ti, and then oxygen content was analyzed. Reflection films were deposited using the target material in a similar way to that in the example 1. The oxygen content of the target material was 1100 ppm, and the reflectance of the reflection film was 60%.

On the other hand, in the Example 1, the oxygen content of a sputtering target material comprising the binary system Al group alloy containing 2 at % of Ti was 100 ppm. The reflectance of reflection films obtained from the target material was 83%, which is a very high value different from the reflectance of 60% in the above-mentioned comparative example 1. This is due to the difference in oxygen contents of both materials.

What is claimed is:

1. A sputtering target, comprising Al and 0.1 to 10 at. % of at least one alloy component selected from the group consisting of Ti, Zr, and Hf, wherein said target comprises one or more intermetallic compounds comprising said at least one alloy component and Al, homogeneously distributed in said Al, and said one or more intermetallic compounds are needle-shaped and have a lateral dimension of less than 200 $\mu$m.

2. The sputtering target according to claim 1, wherein the alloy compound is Ti.

3. The sputtering target according to claim 1, wherein the alloy compound is Zr.

4. The sputtering target according to claim 1, wherein the alloy compound is Hf.

5. A sputtering target, comprising Al and 0.1 to 10 at. % of at least one alloy component selected from the group consisting of Zr and Hf, wherein said target comprises one or more intermetallic compounds comprising said at least one alloy component and Al, homogeneously distributed in said Al, and said one or more intermetallic compounds are needle-shaped and have a lateral dimension of less than 200 $\mu$m.

6. The sputtering target according to claim 5, wherein the alloy compound is Zr.

7. The sputtering target according to claim 5, wherein the alloy compound is Hf.

8. A sputtering target, consisting essentially of Al and 0.1 to 10 at. % of at least one alloy component selected from the group consisting of Ti, Zr, and Hf, wherein said target consists essentially of one or more intermetallic compounds comprising said at least one alloy component and Al, homogeneously distributed in said Al, and said one or more intermetallic compounds are needle-shaped and have a lateral dimension of less than 200 $\mu$m.

9. The sputtering target according to claim 8, wherein the alloy compound is Ti.

10. The sputtering target according to claim 8, wherein the alloy compound is Zr.

11. The sputtering target according to claim 8, wherein the alloy compound is Hf.

* * * * *